(12) United States Patent
Trimberger (10) Patent No.: US 7,991,712 B1
(45) Date of Patent: Aug. 2, 2011

(54) CONSENSUS AS AN EVALUATION FUNCTION FOR EVOLVABLE HARDWARE

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1319 days.

(21) Appl. No.: 10/644,162

(22) Filed: Aug. 20, 2003

(51) Int. Cl.
*G06N 3/12* (2006.01)
(52) U.S. Cl. .......................................... 706/13
(58) Field of Classification Search ............... 706/13
See application file for complete search history.

(56) References Cited

U.S. PATENT DOCUMENTS

2003/0050902 A1 * 3/2003 Buczak et al. ................... 706/13

OTHER PUBLICATIONS

Lohn, J., Crawford, J., Globus, A., Hornby, G., Kraus, W., Larchev, G., Pryor, A., Sriviastava, D. "Evolvable systems for space applications" International Conference on Space Mission Challenges for Information Technology (SMC-IT). (2003) url="citeseer.ist.psu.edu/lohn03evolvable.html".*

Christoph H. Loch • Christian Terwiesch • Stefan Thomke "parallel and sequential testing of design alternatives" management science, vol. 45, No. 5, May 2001.*
Sverre Vigander ("Evolutionary Fault Repair of Electronics in Space Applications" Feb. 2001).*
Sverre Vigander ("Evolutionary Fault Repair of Electronics in Space Applications" University of Sussex, Feb. 2001).*
Xin Yao ("Making Use of Population Information in Evolutionary Arftifical Neural Networks" IEEE 1998).*
Shanthi et al ("GA based on-line testing and recovery for critical digital systems" 2002).*
Shanthi et al ("GA Based On-line Testing and Recovery for Critical Digital Systems" 2002).*
Zhang et al ("Consensus-Based Evolvable Hardware for Sustainable Fault-Handling" 2006).*
Zhang et al ("Consensus-based Evaluation for Fault Isolation and On-line Evolutionary Regeneration" 2005).*

* cited by examiner

*Primary Examiner* — Michael B Holmes
*Assistant Examiner* — Lut Wong
(74) *Attorney, Agent, or Firm* — LeRoy D. Maunu (57) ABSTRACT

An evolution approach involves the automatic generation of an evaluation function. According to an example embodiment of the present invention, a consensus result from a population of designs is used to evaluate designs in the population for fitness. New designs are evolved using the consensus result as an evaluation function, with newly-evolved designs replacing ones of the population of designs determined to be unfit. With this approach, automatic design evolution is carried out independently from a fixed evaluation function, which is sometimes susceptible to error.

31 Claims, 5 Drawing Sheets

CONSENSUS AS AN EVALUATION FUNCTION FOR EVOLVABLE HARDWARE

FIELD OF THE INVENTION

The present invention generally relates to evolvable hardware.

BACKGROUND

Computer and electronic hardware are susceptible to a variety of types of faults that occur under many different operating conditions. For instance, adverse conditions involving temperature, aging, and radiation all present challenges to the operation of circuits. In addition, designs often do not contemplate various conditions and thus can result in undesirable functioning. Recovery from these faults has been the focus of many approaches. One approach that has been successful at addressing faults involves fault-tolerant designs. However, this approach is often prohibitively expensive to implement.

Another approach involves hardware that evolves, or changes, over time. Evolvable hardware approaches use principles of natural selection from the biological world to create electronic hardware designs. The hardware used in evolving designs typically includes a programmable logic-type device. For instance, microprocessors and field-programmable gate arrays (FPGAs) are often used as the implementation target for evolved designs because they can be programmed, tested and reprogrammed many times. In an example process for evolving a design, a population of designs is first randomly created, tested and evaluated based on the suitability to meet the design requirements. Based on natural selection principles, certain ones of the designs in the population are selected to "reproduce," that is, used as a basis to create new designs for the population. The design selected to be eliminated is one with low "fitness." Fitness is measured, for example, by the agreement between the design's output and an evaluation function. The process of testing, evaluating and reproducing is then repeated until a population of suitable designs has evolved.

Continued evolution of a hardware design over the course of time can be useful for overcoming faults, with evolved designs effectively designing around the fault. For instance, when a particular hardware component exhibits a fault, a design that uses that component will no longer exhibit good fitness, since its results will disagree with the evaluation function. A different design that uses other hardware components circumvents the fault, shows better fitness and is used as the basis of future generations. However, this evolution approach depends upon evaluation functions used for selecting the evolved designs. If an evaluation function is not entirely correct, the resulting evolved design reflects faults in the evaluation function and may be unusable. In addition, while evolvable hardware systems tend to degrade gracefully (i.e., they continue to function even after faults occur), accumulation of faults can eventually degrade evolved hardware systems to the point where they are unusable.

In some applications, the ability to withstand faults over a long period of time is of heightened importance. For instance, when circuits are difficult to access or even inaccessible, it is important that the circuits function for long periods of time without failing. One such application is in long-duration unmanned space flights. These flights can last decades and are often out of communication with a control center on Earth for much of that time. In addition, these flights can result in circuits being exposed to ionizing radiation that can cause faults. In these instances, the recovery from faults must be effected without human intervention.

The present invention may address one or more of the above issues.

SUMMARY OF THE INVENTION

According to an example embodiment of the present invention, an evaluation function for evolving a population of designs is automatically generated as a function of result signals from the designs. With this approach, external intervention is not necessary for generating the evaluation function.

According to a more particular example embodiment of the present invention, an electronic system having a population of designs is operated using a design evolution approach involving the use of a consensus result for fitness evaluation. In response to an input signal, each design in the population generates a result signal. A consensus result is determined as a function of at least two of the generated result signals. The fitness of each design is evaluated as a function of the result signals and the consensus result. A new design is evolved from one or more designs in the population and at least one design is replaced with the new design as a function of the fitness evaluation (e.g., a design exhibiting low fitness is replaced).

In another example embodiment of the present invention, an evaluation function is automatically derived for evolving a population of designs. Result signals for a plurality of the designs in the population are generated in response to input signals. A consensus result is automatically determined as a function of the result signals. The fitness of each design in the population is evaluated as a function of the consensus result, and one of the designs in the population is replaced with a new design as a function of the fitness evaluation.

In another example embodiment of the present invention, a fault-tolerant system automatically generates an evaluation function for design evolution. The system includes a programmable device programmed with a plurality of designs, each design being adapted to generate a result signal in response to an input signal. An evaluation block uses the result signals from two or more of the designs to determine a consensus result. The fitness of each design is evaluated using the result signals from each design and the consensus result. An evolution block evolves a new design from one or more designs in the population using, e.g., conventional evolution approaches. At least one design in the population is replaced with the new design using the fitness evaluation to identify the design to be replaced.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of a design evolution approach with programmable hardware such as FPGAs. Those skilled in the art will appreciate that the invention may be implemented in a variety of programming languages, applied to other devices, including programmable logic devices (PLDs) other than FPGAs, and/or adapted to applications.

According to an example embodiment of the present invention, an evaluation function for a population of designs is automatically generated as a function of a consensus result. The consensus result is determined by applying an input signal to several designs in the population to generate a response output from the designs. The outputs from the designs are compared and used to develop the consensus result that is then used as the evaluation function for assessing the fitness of the designs.

The fitness of each design is measured, for example, by evaluating the agreement between the design's output and the consensus result and other design characteristics, such as longevity or performance over time, relative to consensus results. This fitness measurement may be simple agreement of an output of a particular design with outputs from the majority of the designs, or a weighted agreement by degree of consensus with the population. With these approaches, a "known" evaluation function is not necessary for evaluating the population for fitness, allowing the population to evolve independently of any outside intervention or otherwise previously established evaluation functions.

In a more particular implementation, the consensus result is used to identify one or more of the designs that are to be used for implementation in a functioning circuit. For example, where a particular population of designs is used by a control circuit for generating a response to input signals, one of the designs exhibiting highest fitness is programmed to the control circuit. In another example, a selected group (e.g., 3) of the designs are used in parallel by a control circuit. Responses from the three parallel designs are used and compared to select a functional output of the control circuit. In still another example, a plurality of designs exhibiting high fitness is used by a control circuit, with responses from selected ones of the plurality of designs being given relatively higher weight than other designs when used in parallel to generate an output.

Figure 1:
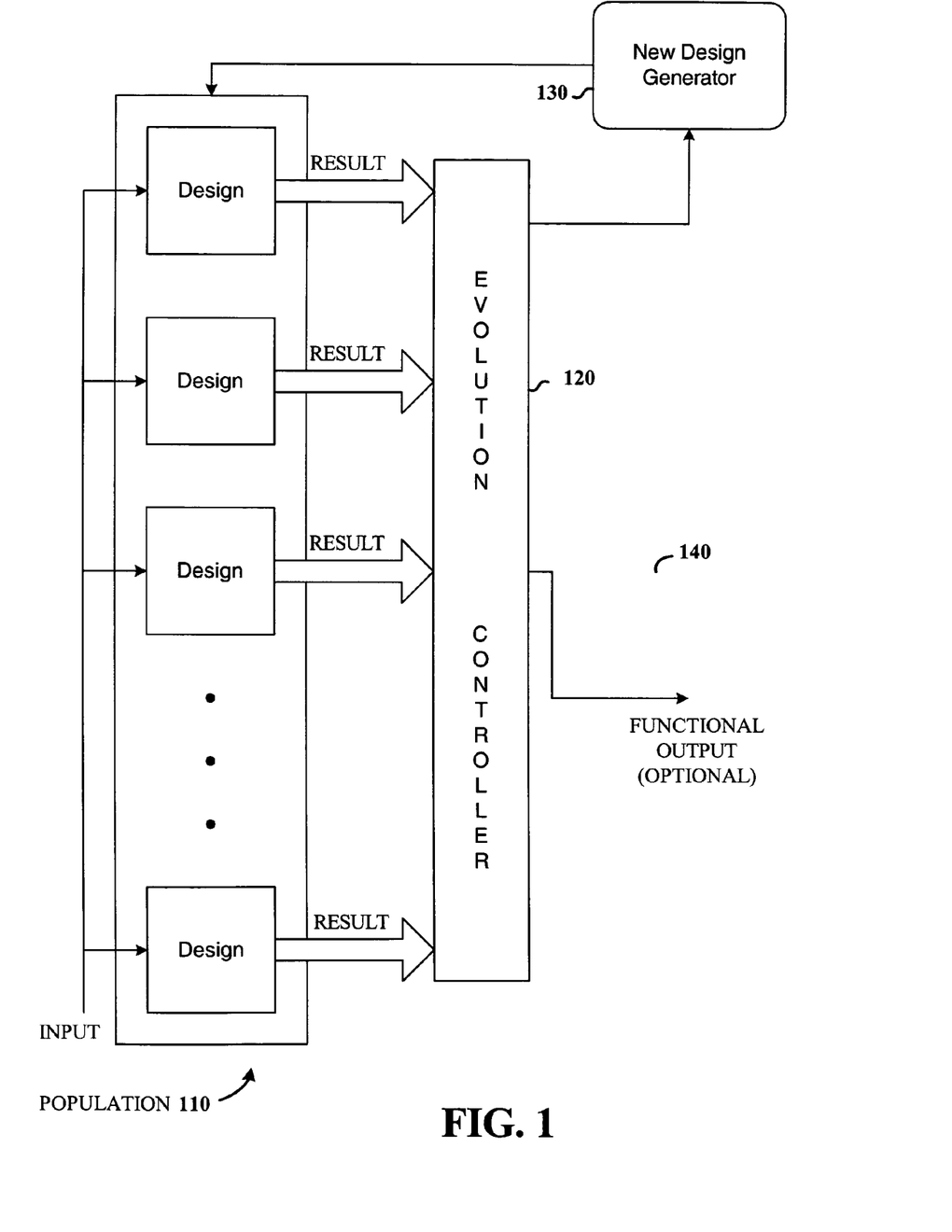
FIG. 1 shows an arrangement and approach for evaluating and evolving a population of designs, according to an example embodiment of the present invention.

FIG. 1 shows an arrangement and approach for evaluation and evolution of a population 110 of designs, according to another example embodiment of the present invention. Each design in the population 110 generates a result output in response to data input, and the result outputs are evaluated at an evolution controller 120 to determine a consensus result. A new design generator 130 generates new designs, with the evolution controller 120 evaluating the fitness of all designs against the consensus result. One or more designs in the population 110 may be replaced with new designs as a function of the fitness evaluation (e.g., when the evolution controller determines that a design is unfit, relative to the consensus result and/or other criteria).

The evaluation for determining the consensus result may use one or more of a variety of approaches. In one implementation, the designs with the best agreement with the consensus result are considered the most fit and are retained, with less fit designs being eliminated. In another implementation, weight is given to selected designs exhibiting robust fitness characteristics such as age (survival over time). These weighted designs are considered more strongly when determining the consensus result, relative to designs that are not weighted.

Optionally, the evolution controller outputs a consensus (or other) result as a functional output 140 arrived at using the results from the designs; the functional output is used in the operation of a particular circuit for which the designs were created.

In another implementation and in accordance with evolvable hardware techniques, rather than using fitness as an absolute measure for elimination, fitness may be used as a bias to increase the probability of eliminating less-fit designs. Evolution may proceed continuously, occasionally, or may be triggered by an event, such as disagreement on a result in operations. In another implementation, wherein a plurality of designs produces inconsistent results, only one of the designs may be replaced. The design being replaced in this instance may not necessarily be the most inconsistent design; rather, the replaced design may be selected to maintain a diverse population as a function of random, fixed or other selection criteria.

Figure 2A:
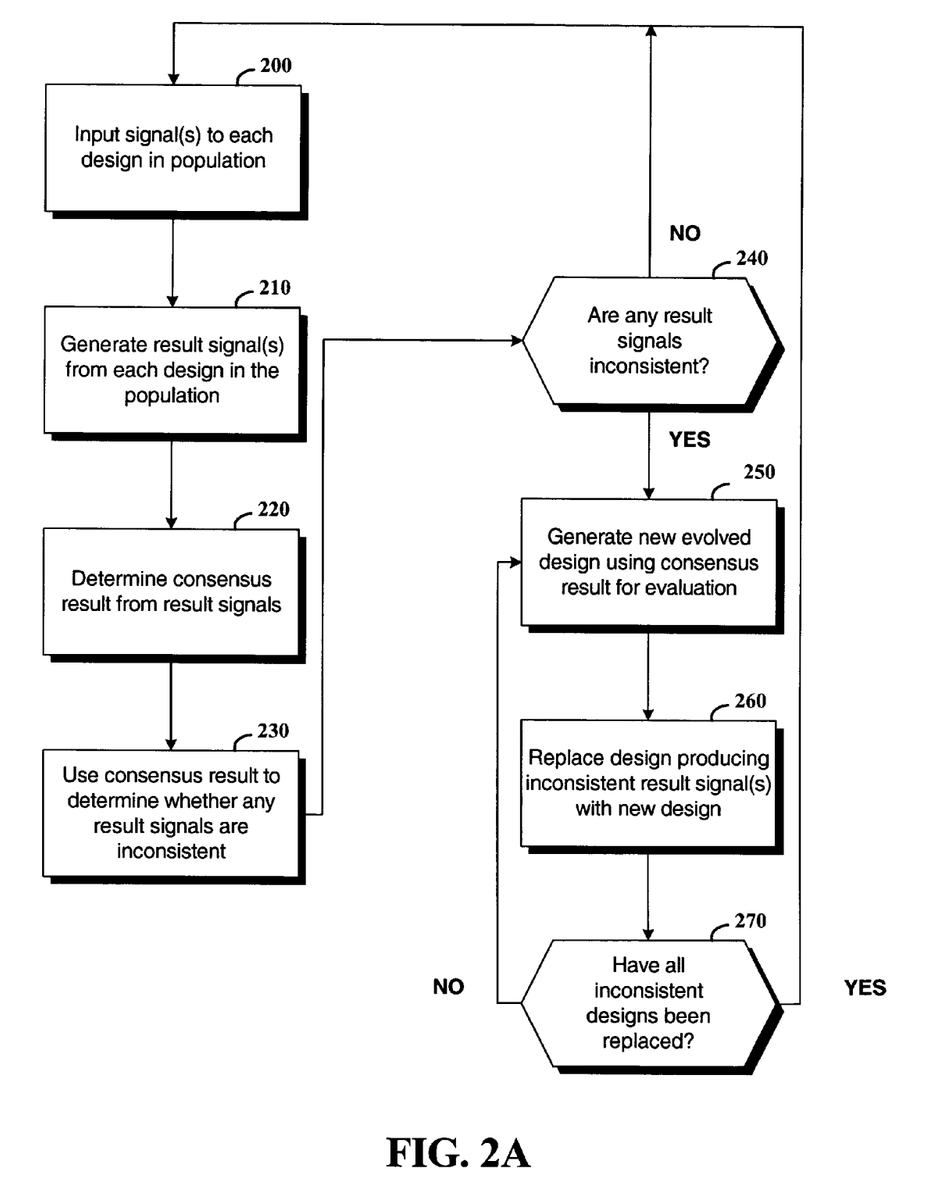
FIG. 2A is a flow diagram showing an approach for evaluating and evolving a population of designs, according to an example embodiment of the present invention.

FIG. 2A is a flow diagram showing another approach to the evolution of a population of designs, according to another example embodiment of the present invention. The flow diagram in FIG. 2A may, for example, be implemented with the example embodiments shown and discussed in connection with FIG. 1. At block 200, a signal is input to each design in the population (e.g., with each design implemented using a programmed circuit such as an FPGA). At block 210, a result signal is generated from each design and a consensus result is determined from the result signals at block 220.

The consensus result is determined using one or more of a variety of approaches, depending upon the implementation and application. For example, the number of members of the population that must agree may vary, as may the degree to which the results from the different members must agree. Various statistical techniques may be used to determine the consensus and whether results are in agreement with the consensus. For example, a statistical mean or median of the results may be used as the consensus result, with those results deviating from the consensus result by some selected amount being deemed as inconsistent with the consensus result. Those skilled in the art will recognize numerous variations of this approach and more sophisticated statistical techniques may be suitable alternatives. For instance, a voting method may be implemented with each design's result signal effectively being a vote for a particular consensus result. In a further embodiment, weights may be assigned to particular designs based on performance or other characteristics so that the particular designs have greater or lesser degrees of impact on the consensus result. When used with a voting approach, weighted designs vote for their result signal with a degree of impact relative to the weight.

Once the consensus result is determined, it is used to determine whether any of the designs produce a result signal that is inconsistent at block 230. An inconsistent result signal may, for instance, be a result signal that when compared to the consensus result is most different, exhibits certain bitwise differences or is out of a particular range of results, relative to the consensus result. If there are no inconsistent result signals at block 240, the process continues at block 200 (e.g., at a selected time, interval or in response to a triggering event, such as a failure).

If there is an inconsistent result signal at block 240, a new evolved design is generated at block 250 using the consensus result for evaluation. The evolved design can be derived, for example, using known or specially adapted circuit evolution approaches. In one implementation, the consensus result is used as an evaluation function to evaluate new designs, with a final new design being selected if consistent with the consensus result. In another implementation, a new design may be generated without immediate evaluation using the consensus result. Once a new design has been generated, the design producing the inconsistent result is replaced with the new design at block 260. If all inconsistent designs have not been replaced at block 270, the process continues at block 250. If all inconsistent designs have been replaced at block 270, the process continues at block 200, as discussed above.

Figure 2B:
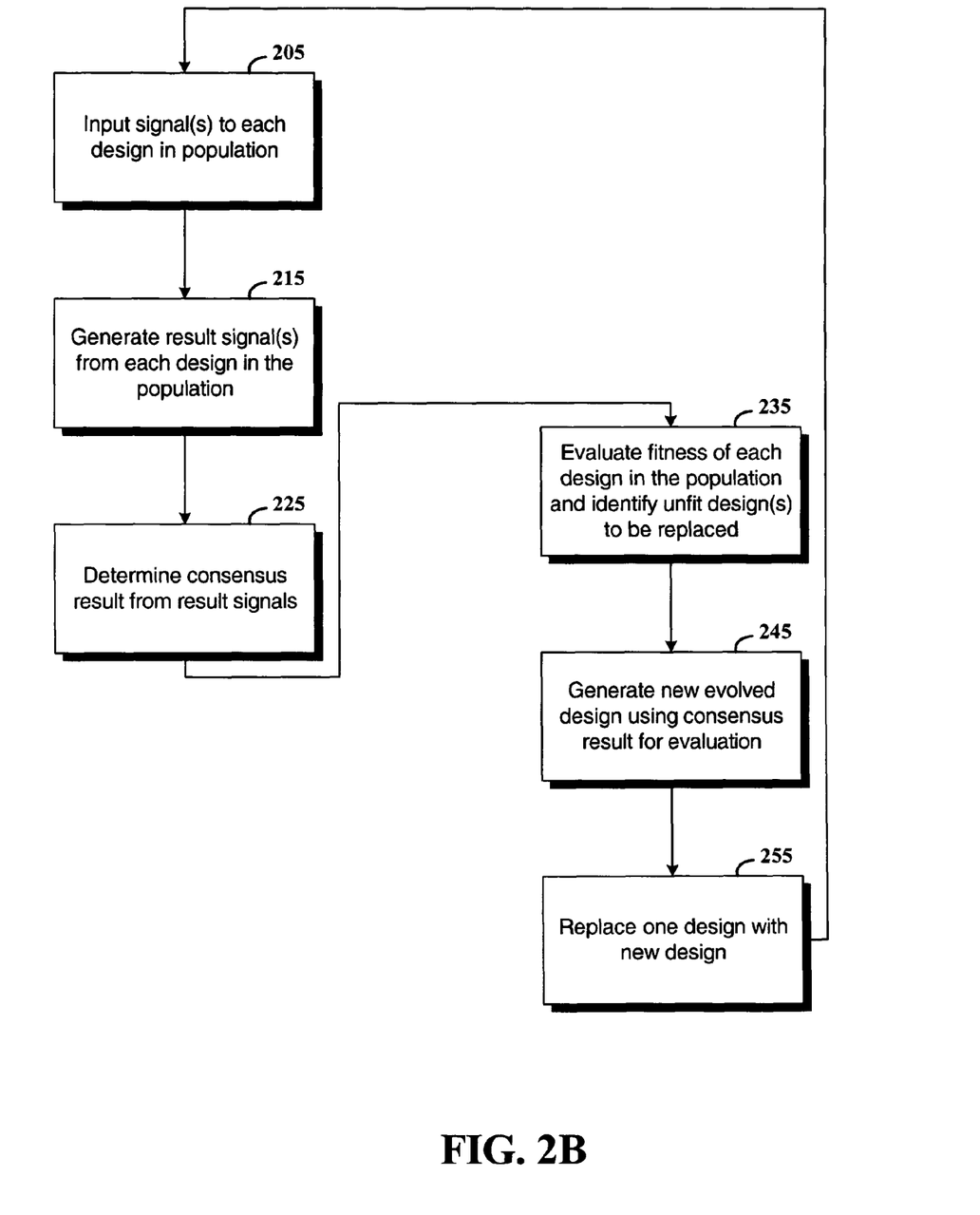
FIG. 2B is another flow diagram showing an approach for evaluating and evolving a population of designs, according to another example embodiment of the present invention.

FIG. 2B is a flow diagram for another approach to evolving a population of designs, similar to that shown in FIG. 2A, according to another example embodiment of the present invention. The flow diagram in FIG. 2B may, for example, be implemented with the example embodiments shown and discussed in connection with FIG. 1. At block 205, a signal is input to each design in the population, with each design implemented, for example, with a programmable circuit such as an FPGA. At block 215, a result signal is generated from each design and a consensus result is determined from the result signals at block 225. The consensus result is determined using one or more of a variety of approaches as discussed in connection with FIG. 2A above. The fitness of each design in the population is evaluated at block 235, with unfit designs being identified. A new evolved design is generated at block 245 using the consensus result as an evaluation function. One design is replaced with a new design at block 255, for example, using weighted, random or other approaches to select the design to be replaced. The design that is replaced at block 255 may be an unfit design or may be chosen using other criteria, for example, as discussed above in connection with FIG. 1. The method described in FIG. 2B may continue until all unfit designs are replaced or may stop after a single replacement or after a fixed number of replacements.

The initial population used in connection with FIGS. 2A and 2B above may be selected using one or more of a variety of approaches. In one instance, the initial population is generated using a known, initially correct evaluation function to evaluate the fitness of each design in the population. This approach has been found useful, for example, where human intervention is possible during the development of the initial population to ensure accuracy of the evaluation function. Once a population of designs is deemed reliable, the designs are stored as the initial designs used in the approaches shown in FIGS. 2A and 2B, with further evolution using the consensus result, rather than the known, initially correct evaluation function. This approach is useful, for example, in implementations where human intervention is not available or is undesirable after the initial population has been generated, such as during space flight.

Figure 3:
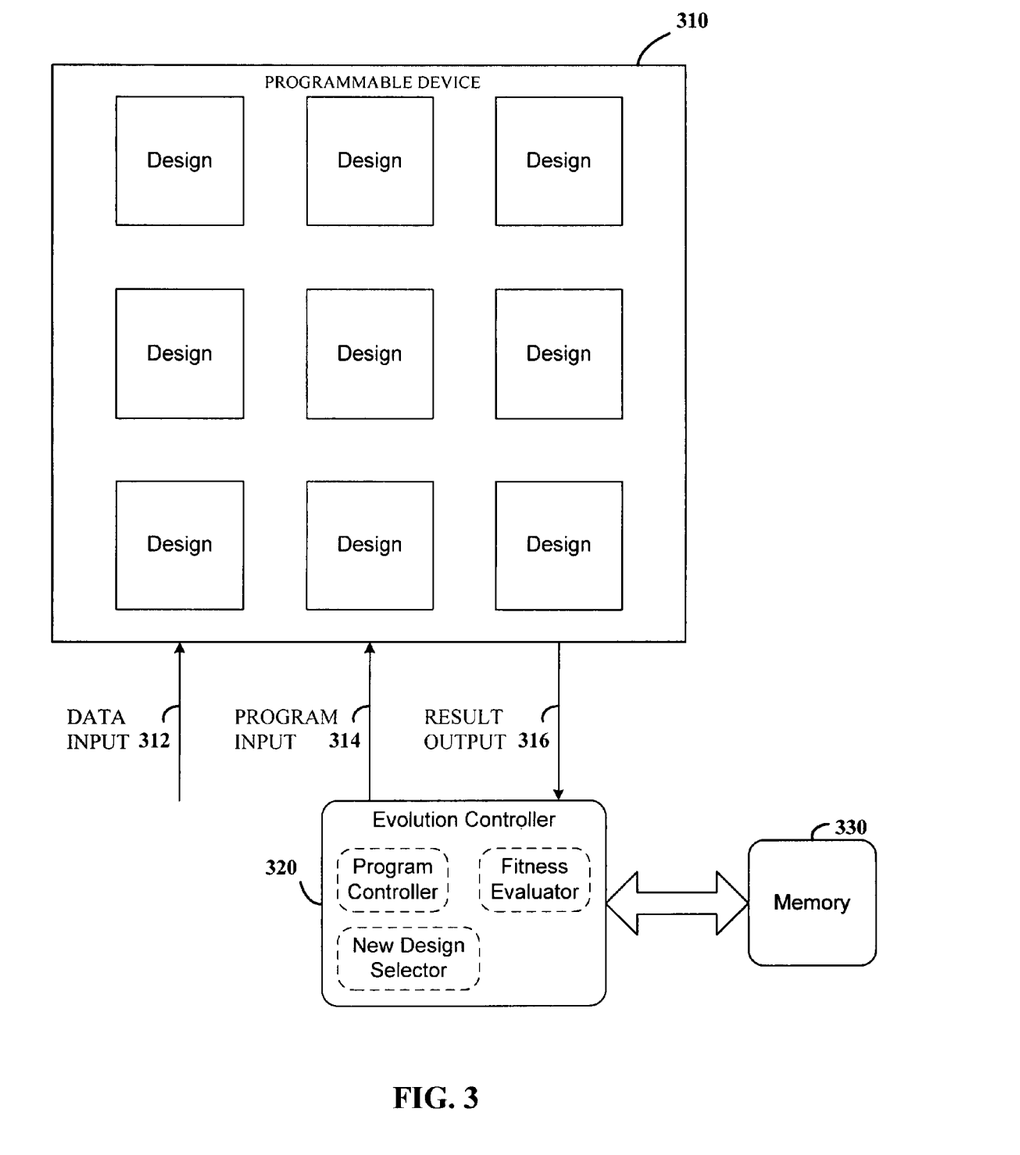
FIG. 3 shows an evolvable hardware system, according to another example embodiment of the present invention.

FIG. 3 shows a programmable device 310 programmed with designs from a population and having an evolution controller 320 that uses a consensus result determined from the designs to control the evolution of the population, according to another example embodiment of the present invention. The programmable device 310 may include, for example, one or more field-programmable gate arrays (FPGAs). The population of designs is stored in a memory 330, with selected ones of the stored designs being programmed to the programmable device 310 using program input 314. Data input 312 is used to input data to the programmed designs, with result data from each design being passed to the evolution controller 320 via result output 316. In one implementation, the evolution controller generates data input 312. The evolution controller uses the result data to generate a consensus result, for example, using one or more of the approaches discussed above. The consensus result is used to evolve new designs that are stored in the memory 330 and/or programmed to the programmable device 310.

The evolution controller 320 is programmed to generate the consensus result in a variety of manners, depending upon the implementation. For example, as discussed above in connection with FIG. 2A, voting methods, weighted results and other approaches can be used to process the result outputs for generating a consensus result. Outputs from designs exhibiting robustness (e.g., survival over a long period of time) may be given more voting weight when using the outputs to arrive at a consensus.

In one implementation, a first set of designs is read from the memory 330 and programmed to the programmable device 310 using the program input 314, data is input thereto at data input 312 and results are output to the evolution controller 320 using result output 316. A second set of designs is then read from the memory 330 and programmed to the programmable device 310 with the evolution controller 320, replacing the first set of designs. Data is then input to the second set of designs, with result data being output to the evolution controller 320. The evolution controller 320 uses the result data from the first and second sets of designs to generate the consensus result. In one instance, a plurality of such iterations involves the programming of additional sets of designs, and in some instances all designs, to the programmable device 310, with result data being used to generate the consensus result.

In another implementation, designs exhibiting robust fitness are programmed to the programmable device 310 via the program input 314 from the memory 330, for example, using fitness evaluation criteria such as design age, output difference from consensus, probability functions and others. The data input 312 is applied to the robust designs programmed to the programmable device 310. Result outputs received by the evolution controller 320 are used to determine a consensus result. The consensus result is used to evaluate the designs stored in the memory 330 for evaluating the fitness thereof. One or more unfit designs stored in the memory 330 are identified. The evolution controller 320 then generates a new design using the consensus result as an evaluation function, and replaces one of the unfit designs stored in the memory 330 with the newly-evolved design. With this approach, selected robust designs are used to determine a consensus result for the evolution of the entire design population stored in memory 330.

In another example embodiment, programmable device 310 contains only a single design at a time and evolution controller 320 sequentially loads designs into the programmable device, provides an identical data input and generates a result output for several designs. The result outputs from at least two of the designs are used to generate a consensus result, which is used to determine a fitness level of the designs stored in memory 330. The designs may be re-tested or rated based on their result outputs that were used to generate the consensus result.

In another example embodiment, evolution controller 320 is implemented on programmable device 310, with programmable device 310 being adapted for programming of a portion thereof with the designs under evaluation while the evolution controller continues to operate. Programmable devices that may be used to implement this approach include, for example, the Virtex-II FPGA available from Xilinx, Inc., of San Jose, Calif.

Figure 4:
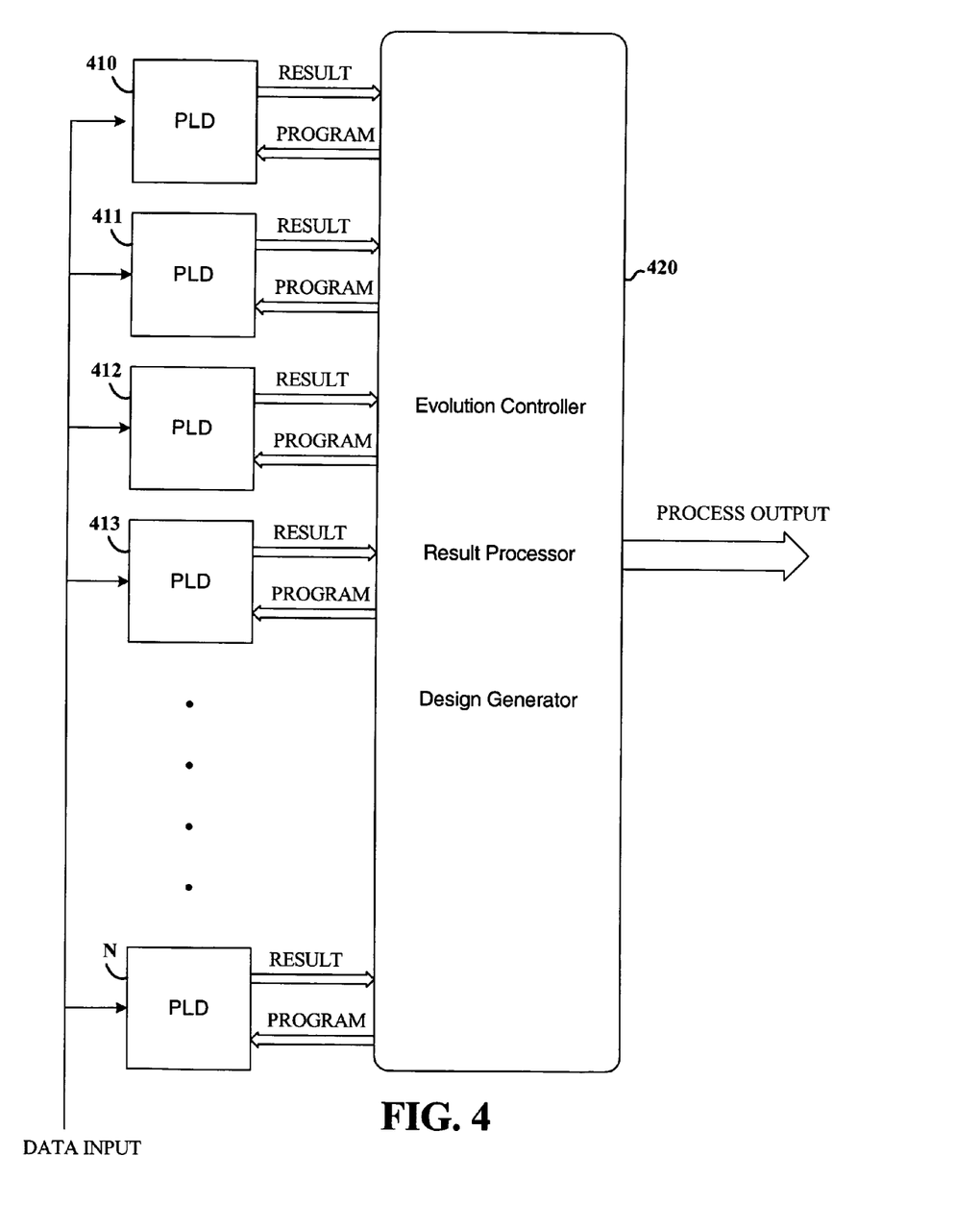
FIG. 4 shows another evolvable hardware system, according to another example embodiment of the present invention.

FIG. 4 shows a system including programmable logic devices (PLDs) 410, 411, 412 and 413-N, operating in parallel, according to another example embodiment of the present invention. Each PLD is programmed with a design from a population of designs, with the consensus result of the PLDs being used for the evolution of new designs. The number of PLDs is selectable up to PLD N, represented by the space between PLD 413 and PLD N. The PLDs 410-N may include, for example, one or more FPGAs. Data is input to each of the PLDs and results are output from the PLDs to an evolution controller 420. The results are processed by a result processor at the evolution controller 420 and used to generate a consensus result, for example as discussed above.

The consensus result is used to evaluate the fitness of the designs programmed to the PLDs. One or more designs of high fitness are used to generate a process output for a particular circuit design. For example, a design evaluated as a best design, or a small group of best designs can be programmed to a particular circuit as a function of the process output. The programmed circuit is then used to generate an output for which the designs are created.

The consensus result is also used as an evaluation function to evaluate new designs evolved from the population of designs using a design generator in the evolution controller 420. New designs meeting the evaluation function are then used for replacing unfit designs in the population as identified with the consensus result and/or other fitness evaluation approaches, such as those discussed above. The evolution controller 420 programs the new designs to PLDs having designs that are to be replaced, and the reprogrammed PLDs are then used to generate another consensus result.

Those skilled in the art will appreciate that various alternative circuit arrangements would be suitable for hosting the processes of the different embodiments of the present invention, including using a microprocessor executing evolved code. In addition, the processes may be provided via a variety of computer-readable media or delivery channels such as magnetic or optical disks or tapes, electronic storage devices, or as application services over a network.

The present invention is believed to be applicable to a variety of systems employing evolvable hardware and has been found to be particularly applicable and beneficial in approaches involving evolvable hardware that is susceptible to faults. In addition, the present invention is believed applicable to systems employing software designs that are inadequate for responding to conditions that may change over time; in this instance, new software designs are evolved to address the changing conditions. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for operating a system having a population of designs, each design being adaptable for use in operating the system, the method comprising:
    in response to an input signal, for each design in the population, generating an associated result signal;
    wherein each design in the population is programmed in a programmable device;
    determining a consensus result as a function of at least two of the generated result signals;
    generating an output from the consensus result for operating the system;
    determining an associated fitness level of each design as a function of the associated result signal and the consensus result;
    evolving one or more new designs from at least one design in the population;
    evaluating each of the one or more new designs for consistency with the consensus result;
    selecting a final new design from the one or more new designs in response to the final new design being consistent with the consensus result;
    selecting for replacement at least one design as a function of the associated fitness level; and
    replacing the design selected for replacement with the new design.

2. The method of claim 1, further comprising weighting one of the at least two generated result signals for use in determining the consensus result.

3. The method of claim 2, wherein weighting one of the at least two generated result signals for use in determining the consensus result includes weighting the result signal as a function of the associated fitness level determined in a prior generation.

4. The method of claim 3, wherein weighting the result signal as a function of the associated fitness level determined in a prior generation includes weighting the result signal as a function of a number of generations in which the associated design has been a member of the population.

5. The method of claim 1, wherein determining a consensus result as a function of at least two of the generated result signals includes accumulating result signals from each of the designs over a period of time and determining a consensus result from the accumulated result signals.

6. The method of claim 1, wherein determining a consensus result as a function of at least two of the generated result signals includes determining a statistical result of the at least two of the generated result signals.

7. The method of claim 1, further comprising outputting the consensus result for use in operating the system.

8. The method of claim 1, further comprising selecting at least one of the designs as a function of the consensus result and the associated result signal to generate an output for use in operating the system.

9. The method of claim 1, wherein determining an associated fitness level of each design includes comparing the associated result signal of each design with the consensus result.

10. The method of claim 9, wherein determining an associated fitness level of each design includes determining the associated fitness level as a function of first and second differences, the first difference being a difference between the associated result signal of the design and the consensus result, the second difference being a difference between the associated result signals of the other designs and the consensus result.

11. The method of claim 10, wherein determining the associated fitness level as a function of the difference between the associated result signal of the design and the consensus result comprises determining a bitwise difference between the associated result signal of the design and the consensus result.

12. The method of claim 10, wherein selecting for replacement at least one design comprises selecting a design having the greatest difference between the associated result signal of the design and the consensus result.

13. The method of claim 1, wherein selecting for replacement the at least one design includes selecting the at least one design as a function of a degree of agreement between the associated result signal of the at least one design and the consensus result.

14. The method of claim 1, wherein selecting for replacement the at least one design comprises randomly selecting at least one design.

15. The method of claim 14, wherein randomly selecting at least one design comprises using the associated fitness level as a bias to increase a probability of selecting each design.

16. The method of claim 1 wherein evaluating the fitness of each design includes weighting the fitness of each design as a function of at least one of: the number of generations in which the design has been a member of the population, a degree of agreement between the associated result signal of the design and the consensus result, and a probability function.

17. The method of claim 1, prior to generating an associated result signal, further comprising:
evolving a preliminary population of designs by determining an associated fitness level of each design in the preliminary population as a function of fixed evaluation criteria; and
in response to satisfaction of selected completion criteria, ceasing evolving the preliminary population of designs and storing the preliminary population of designs as said population of designs from which the associated result signals are generated.

18. The method of claim 1, wherein each of the steps of the method are performed subsequent to an occurrence of at least one of: reaching a selected time; reaching an end of a predetermined time interval; and a triggering event.

19. The method of claim 18, wherein the triggering event is a failure of the system.

20. The method of claim 1, wherein generating the associated result signal for each design in the population comprises:
programming a programmable device with a first design of the population of designs;
reprogramming the programmable device with a second design of the population of designs; and
generating an associated result signal by generating an associated result signal using the second design.

21. A method for evolving a population of hardware designs for operating an electronic hardware system, the method comprising:
in response to an input signal, generating associated result signals for each of a plurality of the hardware designs in the population;
wherein each hardware design in the population is programmed in a programmable device;
determining a consensus result as a function of the associated result signals;
determining an associated fitness level of each of the population of hardware designs as a function of the associated result signal for each design and the consensus result;
evolving a replacement design using at least two of the hardware designs in the population;
evaluating a fitness of the replacement hardware design as a function of the consensus result;
repeating the steps of evolving and evaluating until the replacement hardware design produces a result signal that is within a selected range of result signals from the consensus result; and
selecting and replacing one of the hardware designs in the population with a new design as a function of the associated fitness level of the selected design;
wherein selecting and replacing one of the hardware designs in the population with a new design includes replacing one of the hardware designs in the population with the replacement hardware design that produces the result signal that is within the selected range of result signals from the consensus result.

22. The method of claim 21, wherein determining a consensus result as a function of the associated result signals further includes determining the consensus result as a function of associated fitness characteristics of the plurality of hardware designs.

23. The method of claim 22, wherein determining the consensus result as a function of associated fitness characteristics of the plurality of hardware designs includes assigning weight to each of the associated result signals as a function of the associated fitness characteristics of each hardware design.

24. A system comprising:
a programmable device programmable with at least one of a plurality of designs, each design being adapted to generate an associated result signal in response to an input signal;
a fitness evaluator to determine a consensus result as a function of associated result signals from at least two of the plurality of designs and to determine an associated fitness level of each design of the plurality as a function of the associated result signals and the consensus result;
an evolution controller that evolves one or more new designs from at least one of the plurality of designs, evaluates a fitness of each of the one or more new designs as a function of a result signal of the new design relative to the consensus result, and selects a final new design from the one or more new designs in response to the final new design being consistent with the consensus result; and
a selector to select and replace one of the plurality of designs with the final new design as a function of the associated fitness level of the selected design.

25. The system of claim 24, wherein the fitness evaluator selects at least one of the plurality of designs for implementation in an operational device as a function of the associated fitness levels of the plurality of designs.

26. The system of claim 24, wherein the fitness evaluator determines an associated fitness level of a design exhibiting a fault, the associated fitness level being indicative of the fault, and wherein the selector selects and replaces the design exhibiting the fault as a function of said design's associated fitness level.

27. The system of claim 24, further comprising:
a program controller to sequentially program the programmable device with one design at a time, the input signal being sequentially applied to single designs to generate the associated result signals.

28. The system of claim 24, wherein the programmable device includes a programmable logic device.

29. The system of claim 24, wherein the programmable device includes a microprocessor.

30. The system of claim 24, wherein the programmable device includes at least one of the fitness evaluator and the selector.

31. The system of claim 24, further comprising a memory for storing at least one of the plurality of designs.

* * * * *